(12) United States Patent
Rault et al.

(10) Patent No.: US 8,341,486 B2
(45) Date of Patent: Dec. 25, 2012

(54) REDUCING POWER CONSUMPTION IN AN ITERATIVE DECODER

(75) Inventors: David Rault, Hede-Bazouges (FR); Olivier Souloumiac, St Sulpice la Foret (FR)

(73) Assignee: Silicon Laboratories Inc., Austin, TX (US)

( * ) Notice: Subject to any disclaimer, the term of this patent is extended or adjusted under 35 U.S.C. 154(b) by 331 days.

(21) Appl. No.: 12/751,052

(22) Filed: Mar. 31, 2010

(65) Prior Publication Data

US 2011/0246849 A1    Oct. 6, 2011

(51) Int. Cl.
*H03M 13/00* (2006.01)
(52) U.S. Cl. ........................................................ 714/752
(58) Field of Classification Search .................... 714/752
See application file for complete search history.

(56) References Cited

U.S. PATENT DOCUMENTS

| | | | |
|---|---|---|---|
| 5,535,220 A | 7/1996 | Kanno et al. | |
| 5,754,252 A | 5/1998 | Kuhn et al. | |
| 6,128,043 A | 10/2000 | Tulder | |
| 6,542,203 B1 | 4/2003 | Shadwell et al. | |
| 6,625,234 B1 | 9/2003 | Cui et al. | |
| 6,630,964 B2 | 10/2003 | Burns et al. | |
| 6,721,908 B1 | 4/2004 | Kim et al. | |
| 6,862,325 B2 | 3/2005 | Gay-Bellile et al. | |
| 7,170,849 B1 | 1/2007 | Arivoli et al. | |
| 7,265,792 B2 | 9/2007 | Favrat et al. | |
| 7,369,835 B2 | 5/2008 | Margairas et al. | |
| 7,426,240 B2 | 9/2008 | Peron | |
| 7,440,392 B2 | 10/2008 | Hwang | |
| 2002/0085648 A1 | 7/2002 | Burns et al. | |
| 2004/0123226 A1 | 6/2004 | Lee et al. | |
| 2005/0265486 A1 | 12/2005 | Crawley | |
| 2006/0206778 A1 | 9/2006 | Wehn et al. | |
| 2006/0222115 A1 | 10/2006 | Dornbusch et al. | |
| 2008/0086671 A1* | 4/2008 | Garg et al. | 714/752 |
| 2009/0094470 A1* | 4/2009 | Gao et al. | 713/320 |
| 2009/0213275 A1 | 8/2009 | Trager | |
| 2009/0249160 A1* | 10/2009 | Gao et al. | 714/752 |
| 2009/0282320 A1* | 11/2009 | Liao et al. | 714/784 |
| 2010/0042906 A1* | 2/2010 | Gunnam et al. | 714/780 |
| 2010/0223524 A1* | 9/2010 | Duggan et al. | 714/751 |
| 2010/0306616 A1* | 12/2010 | Kishimoto et al. | 714/752 |

FOREIGN PATENT DOCUMENTS

| | | |
|---|---|---|
| WO | WO 03067877 | 8/2003 |
| WO | WO 2007001305 A1 | 1/2007 |

OTHER PUBLICATIONS

U.S. Patent and Trademark Office, Office Action mailed Sep. 23, 2010 and Reply filed Dec. 20, 2010 in U.S. Appl. No. 11/903,910.

(Continued)

*Primary Examiner* — Yolanda L Wilson
(74) *Attorney, Agent, or Firm* — Trop, Pruner & Hu, P.C.

(57) ABSTRACT

A method for controlling power consumption of an iterative decoder based on one or more criteria is described. The method may include performing iterative decoding on a demodulated signal to provide a decoded signal, determining whether the iterative decoding is suffering an impairment, and terminating the iterative decoding responsive to the determination of the impairment, otherwise continuing the iterative decoding to provide the decoded signal.

21 Claims, 6 Drawing Sheets

OTHER PUBLICATIONS

U.S. Appl. No. 12/751,022, entitled "Multi-Standard Digital Demodulator for TV Signals Broadcast Over Cable, Satellite and Terrestrial Networks," filed Mar. 31, 2010 by Pascal Blouin, et al.

U.S. Appl. No. 12/751,076, entitled "Techniques to Control Power Consumption in an Interative Decoder by Control of Node Configurations," filed Mar. 31, 2010 by David Rault, et al.

U.S. Appl. No. 12/493,955, filed Jun. 29, 2009, entitled, "Digital Signal Processor (DSP) Architecture for a Hybrid Television Tuner," by Alan Hendrickson, et al.

U.S. Appl. No. 12/603,877, filed Oct. 22, 2009, entitled, "Digital Signal Processor (DSP) Architecture for a Hybrid Television Tuner," by Alan Hendrickson, et al.

U.S. Appl. No. 12/551,146, filed Aug. 31, 2009, entitled, "Digital Phase Lock Loop Configurable as a Frequency Estimator," by Li Gao.

Ahmad Darabiha, "Power Reduction Techniques for LDPC Decoders," pp. 1-10.

ETSI, Draft ETSI EN 302 307, "Digital Video Broadcasting (DVB); Second generation framing structure, channel coding and modulation systems for Broadcasting, Interactive Services, News Gathering and other broadband satellite applications," V1.1.1, 2004-2006, pp. 1-74.

Micronas, "DRX 3960A Digital Receiver Front-End," Feb. 8, 2001, pp. 1-30.

NXP, "TDA 8295 Digital Global Standard Low IF Demodulator for Analog TV and FM Radio," Feb. 4, 2008, pp. 1-77.

XCEIVE, "Welcome to Xceive at CES 2007, Upgrade Your Tuner! Get XC5000," 2007, pp. 1-28.

XCEIVE, "XC5000 Product Brief," Dec. 2006, pp. 1-2.

U.S. Appl. No. 12/323,040, filed Nov. 25, 2008, entitled "Low-Cost Receiver Using Automatic Gain Control," by Ramin K. Poorfard, et al.

* cited by examiner

REDUCING POWER CONSUMPTION IN AN ITERATIVE DECODER

BACKGROUND

Iterative decoding is a very powerful decoding technique used in many forward error correction (FEC) circuits for digital demodulation (and also for storage). Several standards implement decoding techniques such as Turbo codes and low density parity check (LDPC) decoding. For example, Turbo code is used in 3GPP and IEEE 802.16 standards, and LDPC is used in various recent digital video broadcast (DVB) standards including DVB-S2, DVB-T2 and DVB-C2. Iterative decoding outperforms error correcting capabilities in comparison with classical decoding. However iterative decoding implies a higher decoding frequency in order to perform many iterations and also increases complexity of a demodulator.

To realize high performance and high bit decoding throughput, the drawback is an increase in power consumption and thus power dissipation for a package that includes such a decoder. The typical power consumption for iterative decoding can be 50% or more of an entire chip's power consumption. Existing techniques for power reduction in LDPC decoding are based on reducing the iteration number or the activities of check node processors of the decoder when the iterative decoder is correcting errors successfully.

SUMMARY OF THE INVENTION

According to one aspect, the present invention includes an iterative decoder that can be configured to enable reduced power consumption. For purposes of illustration, a LDPC decoder is described, however embodiments are not limited to any particular type of iterative decoder.

A representative decoder may include a set of nodes, each generally including a variable node processor to receive a channel input and at least one check node value to enable calculation of a variable node value, and a check node processor to receive at least one variable node value and to calculate a check node value including a parity value and a magnitude value and provide a first output having a first value if the parity value is of a false parity. The variable node and check node processors may be coupled via a shuffle unit. In turn, an adder may be coupled to the check node processors to receive the first outputs and to generate a false parity sum. In addition, a controller may be coupled to the adder to receive the false parity sum and to control iterative decoding on a current block of the channel input based at least in part on the false parity sum.

Such control may be realized using different criteria, depending on a desired implementation. Example criteria include terminating the iterative decoding based at least in part on the false parity sum, such as based on comparison of the sum to a first threshold. Another example may be to terminate iterative decoding where a false parity sum of a current iteration is greater than the false parity sum of a previous iteration. In yet other implementations the control of iterative decoding may be based on an estimate of a noise level of a signal from which the channel input is obtained.

Another aspect of the present invention is directed to a method for controlling power consumption of an iterative decoder based on one or more criteria. To this end, the method may include performing iterative decoding on a demodulated signal to provide a decoded signal, determining a whether the iterative decoding is suffering an impairment, and terminating the iterative decoding responsive to the determination of the impairment, otherwise continuing the iterative decoding to provide the decoded signal. This impairment determination may be based on various criteria such as discussed above, both internal to the decoding, as well as global criteria.

Embodiments may be incorporated into a system such as a receiver to receive radio frequency (RF) signals of any of multiple digital video broadcasting (DVB) standards and to downconvert the received RF signal to a baseband signal and demodulate the baseband signal into a demodulated signal. This receiver may include a forward error correction (FEC) circuit including an iterative decoder such as described above. In turn, the iterative decoder can be controlled to reduce power consumption using a controller that control terminate the iterative decoding responsive to determination of an impairment, such as based on a temperature of the receiver and/or a signal-to-noise ratio of the received RF signal.

DETAILED DESCRIPTION

Figure 1:
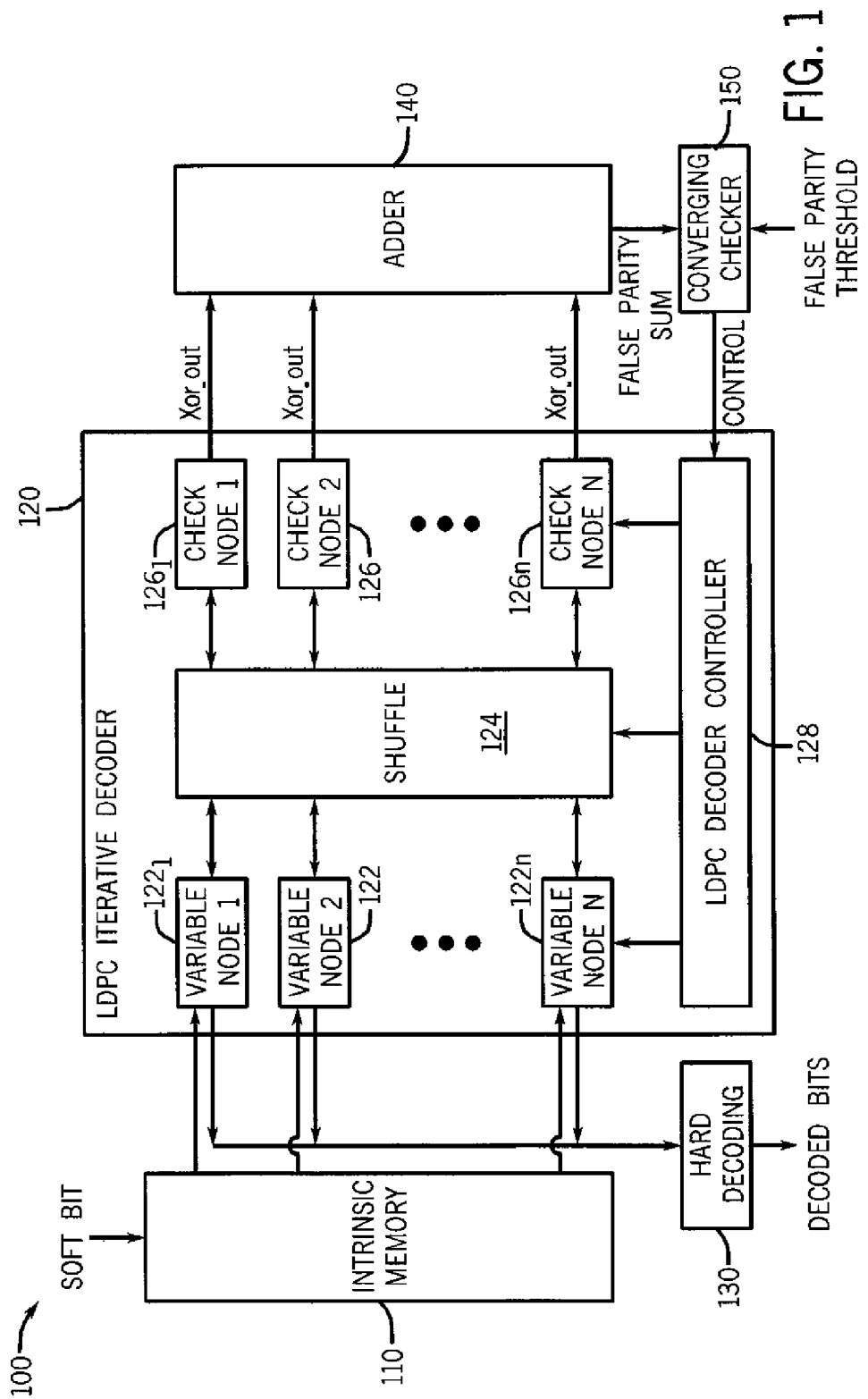
FIG. 1 is a block diagram of an iterative decoder in accordance with one embodiment of the present invention.

In various embodiments, an iterative decoding architecture may allow reduced power consumption using mechanisms to limit power consumption and dissipation in cases of useless iterative decoding. For example, when noise of a received signal is too high, the iterative decoding cannot successfully decode the signal even if the demodulator is locked onto the signal. In this case, the workload of the LDPC decoder is very high because the iterative decoder is trying to correct errors without success. As a result, power consumption is high (and thus dissipation is too). Accordingly, mechanisms may be used to detect such a case and to limit this useless iterative decoding. This avoids wasting power consumption in case of bad decoding and protects a chip including such a decoder from high dissipation. In this way, a low cost small semiconductor package for a receiver can be realized, which may be readily adapted to target consumer applications.

That is, in cases where an iterative decoder faces some difficulties in correcting errors, the decoding may be controlled in order to not spend useless power in the iterative decoder. These difficulties could be through a lack of iterations to correct all erroneous bits. This case could happen for low signal-to-noise ratios (SNR) and high bit rate. Other difficulties could be from very low SNR when the iterative decoder does not succeed in correcting erroneous bits in cases of no success in reducing unconfident soft bits. Indeed, the maximum power consumption is in the case of bad reception, and the worst case is when the iterative decoding is not converging. In this case the demodulator provides a valid symbol to the demapper but with a high noise level so the iterative decoder cannot succeed in reducing the unconfident soft bits. In this case, the iterative mechanism is not converging and the computation cost is very high. Thus embodiments may act as a protective system against high power consumption and dissipation for a semiconductor integrated circuit (IC) integrating iterative decoding.

According to different embodiments, one or more of several criteria can be used in order to stop or limit the number of iterations used in an iterative decoder. For purposes of discussion an exemplary iterative decoder to be described is an LDPC decoder, however, the scope of the present invention is not limited in this regard. A first criterion is to use a temperature sensor in the IC in order to determine whether there is excessive/unexpected power dissipation. If so, iterative decoding may be halted or the number of iterations limited. In this case, it is not known if there is problem in iterative decoding, e.g., due to a very disturbed signal, but an assumption is made that excessive power consumption (including a higher chip temperature) is due to the iterative decoder. As a result, iterative decoding can be stopped or a number of iterations performed may be reduced. Note however that in one embodiment, the iterative decoder can quickly re-enter full iterative decoding when the temperature is better. In this way, using a protective system in accordance with an embodiment of the present invention, the demodulator can remain locked and decoding performance can increase quickly.

A second criterion is to determine a SNR value for an incoming signal, e.g., using a SNR estimator, and halt or limit iterative decoding when the SNR is lower than a threshold value. In one embodiment, a table of threshold SNR levels (e.g., in terms of decibels (dB)) may be determined for each constellation and code rate used (or other parameter impacting the SNR). A comparison between the determined SNR value and the corresponding threshold can be made, and when the SNR is below this threshold the iterative decoding may be stopped or limited.

Yet another criterion is to determine whether the iterative decoding is converging. Iterative decoding convergence can be evaluated by counting for each iteration the number of updated intrinsic values below a threshold (if an updated intrinsic value is below the threshold, then it implies that it is not a safe/stabilized value; in this case, the soft bit confidence is low). So for each iteration, if this counting result is reducing, then the iterative decoder is correcting. Otherwise, the decoding can be stopped/limited. For LDPC decoding, it is possible to compute for each iteration a parity check result for all equations to obtain the number of false parity check equations. By computing the number of false parity equations, an accurate measure of the correcting effect can be obtained. This false parity number should decrease for each iteration when the decoder succeeds to correct errors. This information may allow a more precise determination of when it will be interesting to stop the decoding to avoid useless power consumption.

Moreover this measure is useful to check when the error correcting is bad (not converging) and to stop the iterative decoding to reduce power consumption. This can be very useful when the SNR is very low such that the iterative decoder faces lots of difficulties and needs more power for a bad result. Indeed, the maximum power consumption is in the case of bad reception and the worst case is when the iterative decoding is unsuccessful. The advantage of this criteria is that a continuous check may occur on the processing performed by the iterative decoder for each iteration (not globally, such as for the temperature/SNR criteria). Then this system can continuously control the iterative decoding effort to avoid useless consumption.

A still further criterion may be based on an architecture of which the LDPC decoder is a part. For example, if additional error correction capabilities are provided, the iterative decoding can be stopped or limited more quickly. For example, it is possible to stop the iterative decoding more quickly if there is another correction code circuit after the iterative decoder in order to reduce power consumption and use advantageously the concatenated code.

Yet a further criterion may be to use a continuous checking on a statistic on the number of iterations used to decode bits. This criterion is based on implementations of the iterative decoding converging checking described above to stop the iterative decoder when all errors appear to be corrected (for an LDPC decoder, this may occur when the false parity sum is, e.g., 0 or close to 0). Then with few error bits, only some iterations are necessary. However, the LDPC decoder uses a high number of iterations when there are more bit errors to correct. Thus when this iteration level is often to the maximum iterations of the decoder, then there is a high probability that erroneous bits exist in the output. According to this criterion, a value (e.g., a mean value) based on the number of iterations used to decode can be determined, and compared to a threshold. Another way may be to count the number of iterations higher than a threshold on a time sliding window (e.g., for an LDPC decoder, this could be on some number of frames). If the mean (or previous counter) result is higher than a threshold, it can be assumed that the decoder is beginning to meet difficulties in decoding, and that the power consumption is increasing uselessly. Thus the maximum iteration number allowed may be reduced to reduce useless power consumption.

In one embodiment, iterative decoding activity can be stopped or reduced by controlling the maximum number of iterations allowed. Setting a maximum iteration number to zero will stop the iterative decoder (with eventually only hard decoding). Other values can be used to allow fine customization of the power reduction. Note that for the two last criteria the iterative decoding may at least initially proceed since some iterations need to be performed before making a decision.

Thus in various environments, power consumption can be controlled when the iterative decoder is suffering from some type of impairment. These impairments can be based on a global reason, such as poor SNR levels. In other implementations the impairment may be due to the failure to fully correct erroneous bits in the iterative decoder (for example in case of high symbol rate which could make insufficient iterations available, and thus useless power consumption).

While an iterative decoder may take many forms in various embodiments, referring now to FIG. 1 shown is a block diagram of an iterative decoder in accordance with one embodiment of the present invention. As shown in FIG. 1, decoder 120 may be part of a receiver 100 such as a digital receiver to receive and demodulate incoming IF signals such as TV signals of a given DVB standard. As seen in FIG. 1, decoder 120 may be an LDPC decoder, however according to various embodiments any type of iterative decoder may be possible. The LDPC decoder could be full parallel or serial or semi-parallel. Incoming bits which may be soft bits of a channel input, e.g., as determined via an equalizer and demapper, may be provided and stored in an intrinsic memory 110. As one example, intrinsic memory 110 may be an internal store such as a random access memory (RAM).

The soft bits may be provided from intrinsic memory 110 to iterative decoder 120, and more specifically each bit of the channel input from the intrinsic memory may be provided to a corresponding one of a plurality of variable node processors $122_1$-$122_N$. As seen in the configuration of FIG. 1, each variable node processor 122 may be coupled to a shuffle unit 124, which may provide interconnections between the variable nodes and one or more of a plurality of check node processors $126_1$-$126_N$.

In one embodiment, decoder 120 may be configured as a min-sum decoder. Each decoding iteration includes updating and transferring a message in the form of a log-likelihood ratio (LLR). At the beginning of min-sum decoding, the variable node processors pass a LLR value of the incoming soft bits to a neighboring check node processor via the shuffle unit. In each iteration, a check update occurs followed by a variable update. During the check update, the check node processors determine and output as a magnitude a minimum of the input magnitudes, and a sign as a parity of the signs of the inputs. During the variable update phase, the variable node processors calculate a sum of the inputs from the check node processors plus the channel input. Further details regarding operation of an iterative decoder can be found in Annex G.2 of ETSI EN 302 307 V.I.I.I. (2004-06).

Thus, a min-sum operation occurs. The check node processors perform a computation (e.g., MIN operation in min-sum decoding), the outputs of which are provided back to the variable node processors through shuffle unit 124. In turn, the inputs to the variable node processors arrive from the intrinsic memory and one or more check node processors through shuffle unit 124. The shuffle unit thus may be used in the two directions. After performing the message update (e.g., SUM operation in min-sum decoding), the variable node processor outputs are sent back to the check node processors for the next decoding iteration. Decoding proceeds with all check node processors and variable node processors alternately performing their computations for a predetermined number of iterations, after which the decoded bits are obtained from one final computation performed by the variable node processors and provided to, e.g., a hard decoder 130. As seen, each of the variable node processors, check node processors and the shuffle unit may be under control of a decoder controller 128. Decoder controller 128 may operate to control the iterative decoding process and to stop it using one or more criteria, as discussed above and will be described further below.

Thus each variable node processor may perform a sum operation on a plurality of check node values (and the channel input) to generate a variable node value. The check node processors each may receive one or more of the variable node values and determine a minimum value (i.e., a check node value) which in turn are provided via shuffle unit 124 to one or more of the variable node processors. The resulting outputs of the variable node processors may be provided to hard decoder unit 130 which then generates hard decisions to output decoded bits therefrom. In one embodiment, hard decoder unit 130 may use a sign of the variable node message to determine if the output is 0 or 1.

As further seen in FIG. 1, check node processors 126 each also may output an exclusive-OR value (XOR) to an adder 140, which corresponds to the parity output of the check node processors. Adder 140 then sums these XOR values to determine a false parity sum. That is, each check node processor 126 may output an XOR value of a first logic value (e.g., a logic one value) when a false parity is detected for the corresponding check node. As result, adder 140 may thus generate a false parity sum which it provides to a convergence checker 150. Based on the false parity sum, in addition to other information, including thresholds, constellation, and code rate, a convergence checker 150 may generate a stop iteration signal which may be sent to controller 128 to thus control or limit the amount of iterative decoding performed in decoder 120. While shown with this particular implementation in the embodiment of FIG. 1, understand the scope of the present invention is not limited in this regard.

Figure 2:
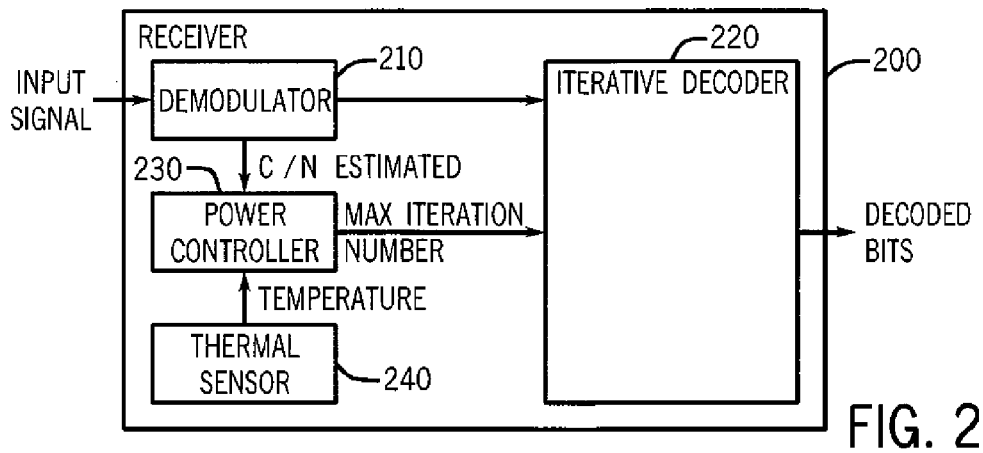
FIG. 2 is a high-level block diagram of a receiver in accordance with one embodiment of the present invention.

Note that an iterative decoder in accordance with an embodiment of present invention can be implemented in many different types of systems. Referring now to FIG. 2, shown is a high-level block diagram of a receiver in accordance with one embodiment of the present invention. As shown in FIG. 2, receiver 200 may receive an input signal. While the receiver may include various front-end circuitry, for ease of discussion the input signal is shown being provided directly to a demodulator 210. In various embodiments, demodulator 210 may be a digital demodulator that operates in accordance with any given DTV standard to receive incoming signals, e.g., at a digital IF frequency, and to demodulate the signal down to baseband. As seen in the embodiment FIG. 2, demodulated signals output from demodulator 210 may be provided to iterative decoder 220. While shown as being directly coupled in the embodiment of FIG. 2, understand that the scope of the present invention is not limited in this aspect. That is, in many implementations additional signal processing circuitry such as an equalizer or other signal processing circuitry may be present in the signal processing path between demodulator 210 and iterative decoder 220.

To control power consumption in iterative decoder 220, various information may be provided to a power controller 230. As seen, power controller 230 may generate a maximum iteration signal to be provided to iterative decoder 220. This signal may thus operate to control decoder 220 to perform no more than this maximum number of iterations.

As seen, power controller 230 is coupled to receive a SNR estimate signal from demodulator 210 and a temperature signal from a thermal sensor 240. In general, the SNR estimate signal may be determined using a SNR estimator, which may be located within the demodulator 210 or another portion of receiver 200. Thermal sensor 240 may be an on-die sensor, e.g., configured as a resistor stack or other circuitry to generate a measure of on-die temperature. As discussed above since iterative decoder 220 may be responsible for a large portion of the power consumption of receiver 200, as temperature increases (indicated by the temperature signal provided to power controller 230) can be an indication of excessive iterations being performed in decoder 220 such as may occur when iterative decoding is not favorably proceeding.

The SNR estimate signal may similarly be indicative of whether an incoming signal of a desired channel is suffering a too high impairment for the iterative decoder due to noise present. Accordingly, in various embodiments to reduce useless power consumption, power controller 230 may, based on one or more of the temperature value and the SNR estimate, reduce the maximum number of iterations allowed, effectively reducing power consumption in the case where the decoding may not be providing a benefit. In different implementations, both of these values may be used in determining whether to stop or limit iterative decoding. In other implementations one of these signals may be used independently of the other to control stopping/limiting of iterative decoding.

Figure 3:
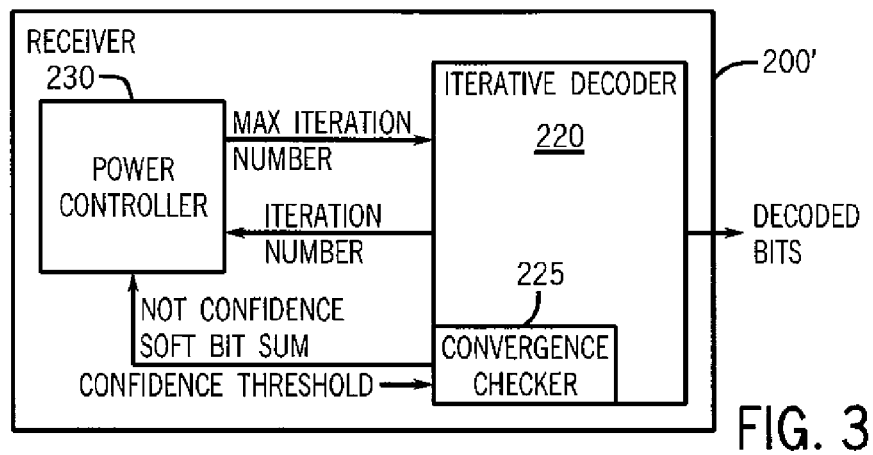
FIG. 3 is a block diagram of a receiver to accommodate power control based on convergence checking in accordance with one embodiment of the present invention.

In addition to controlling power consumption of iterative decoding based on one or more of signal-to-noise ratio or temperature, instead (or in addition) controlling power consumption may occur when decoding is not proceeding favorably. Referring now to FIG. 3, shown is a block diagram of a receiver to accommodate power control based on convergence checking. In general, receiver 200' may be similarly configured to that of receiver 200 of FIG. 2. Note that the demodulator and thermal sensor however are not shown in FIG. 3 for ease of illustration. Instead a convergence checker 225, which is shown in FIG. 3 as being internal to the iterative decoder 220 may be present. This convergence checker may receive a confidence threshold and based on information from the decoding process generate a sum value which is indicative of a no confidence decision for the soft bits generated in iterative decoder 220. In one embodiment, the confidence threshold may be received from a controller of the system, e.g., a digital signal processor of a receiver. However, the threshold may be received from other locations such as an embedded hardware controller with a look-up table according to constellation, code rate and other parameters.

In operation of the iterative decoder of FIG. 3, a value indicative of the number of iterations performed (also referred to herein as an iteration index) may be provided from iterative decoder 220 to power controller 230. Based on this information and the not confidence soft bit sum provided by convergence checker 225, power controller 230 may control the maximum iteration value provided to iterative decoder 220, which may in turn control the maximum number of iterations performed, as discussed above regarding FIG. 2. While shown as a separate control criteria in the embodiment of FIG. 3, understand that this convergence information may be combined with one or more of the SNR and temperature values discussed above and identically this combination is possible with the false parity sum 140 for the case of LDPC decoding.

Figure 4:
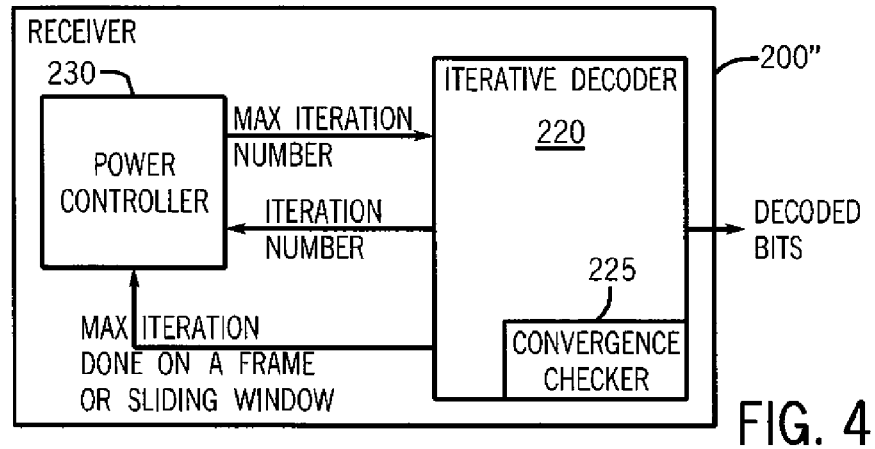
FIG. 4 is a block diagram of a decoder to control power consumption in accordance with one embodiment of the present invention.

In another implementation, a power control decision can be made based on an analysis of how many data blocks (e.g., of a frame size or based on a sliding window) for which a maximum number of iterations are performed (or how many times the iteration index is higher than a threshold). When a maximum number of iterations are performed for a given frame, this is an indication that there may be difficulties in the decoding and thus power consumption may be increasing uselessly. Referring now to FIG. 4, shown is a block diagram of a decoder to control power consumption based on an iteration index analysis. As seen in FIG. 4 receiver 200" includes an iterative decoder 220 that has a maximum iteration number provided by power controller 230. In the embodiment of FIG. 4, power controller 230 may receive an indication of how many data blocks such as a frame or sliding window occurred for which a maximum number of iterations of the iterative decoder 220 was performed. Based on this information, the maximum iteration value provided to iterative decoder 220 may be controlled to thus reduce power consumption where the decoder may be having difficulties. Note that while the above discussion of FIGS. 2-4 is described independently, in different implementations multiple of these different criteria can be combined to control power consumption in an iterative decoder.

A power controller in accordance with an embodiment of the present invention may perform various operations to control power consumption of an iterative decoder based on analysis of one or more different types of criteria such as discussed above. Further, understand that while shown in the implementations of FIGS. 2-4 as a separate power controller of a receiver, embodiments may be implemented in various circuitry of a receiver, including within a decoder itself, a DSP or other microcontroller unit of a receiver.

Figure 5:
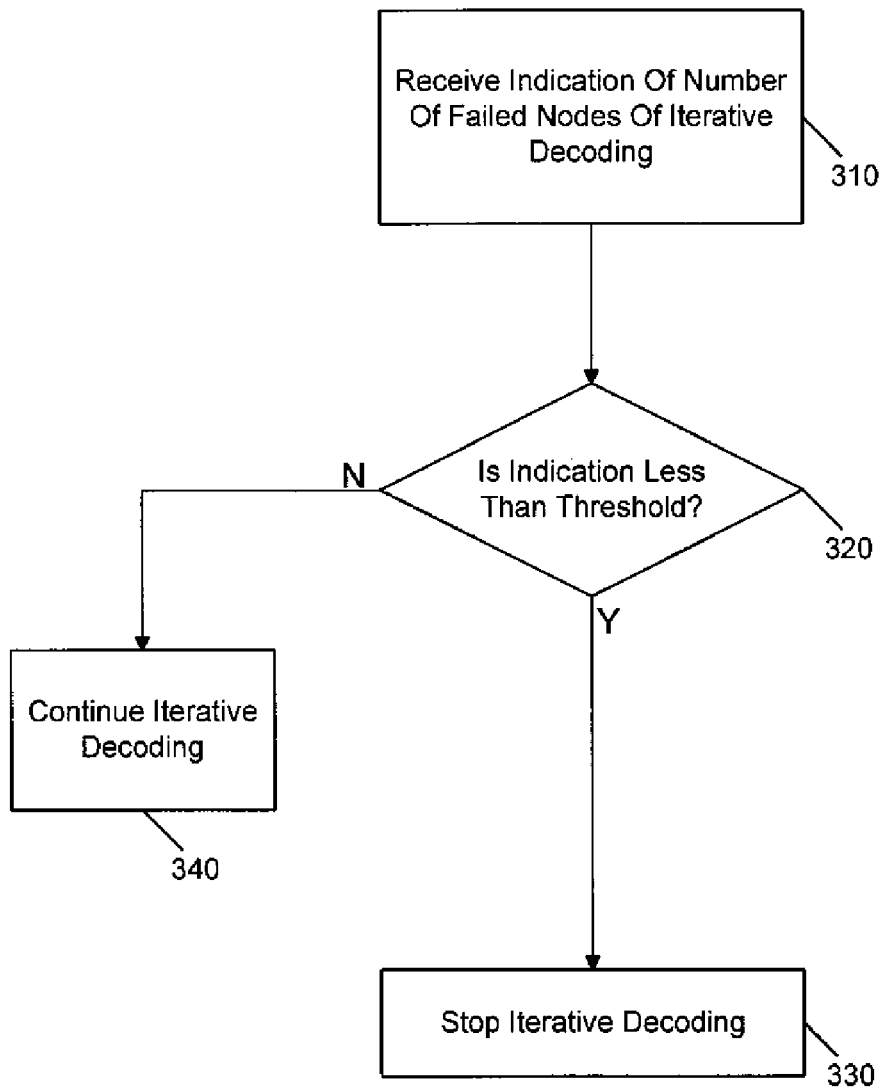
FIG. 5 is a flow diagram of a method for controlling power of an iterative decoder in accordance with an embodiment of the present invention.

Referring now to FIG. 5, shown is a flow diagram of controlling power of an iterative decoder in accordance with an embodiment of the present invention. As shown in FIG. 5, method 300 may be used to perform power reduction based on successful error correction in an iterative decoder.

As seen, method 300 may begin by receiving an indication of a number of failed nodes of an iterative decoder for each iteration (block 310). This indication may be provided in various manners. For example, in an embodiment of an LDPC decoder, this indication may be by way of a false parity checksum. However, more generally for an iterative decoder, the indication may be a bit sum of a low confidence or no confidence decision for a given soft bit. As seen, this received indication may be compared to a threshold to determine whether the indication is less than the threshold (diamond 320). While the scope of the present invention is not limited in this regard, this threshold may be at a given level, e.g., 1 if no outer code is present and else at 10. If the number of the indication is below this threshold, meaning that the number of errors is lower than the threshold, the controller may control the iterative decoder to stop iterative decoding (block 330). That is, as the decoding is successfully realized, further iterations may only act to consume power needlessly. Note that while a given threshold may be present, in an implementation where additional error correction coding such as an outer code is present, this threshold may be greater (meaning that more errors can be tolerated in the iterative decoder) in the presence of the possibility of additional error correction performed elsewhere in a receiver.

Still referring to FIG. 5, if instead at diamond 320 it is determined that the indication is greater than the threshold, control passes to block 340 where iterative decoding may be continued. While shown with this particular implementation in the embodiment of FIG. 5, understand the scope of the present invention is not limited in this regard.

Figure 6:
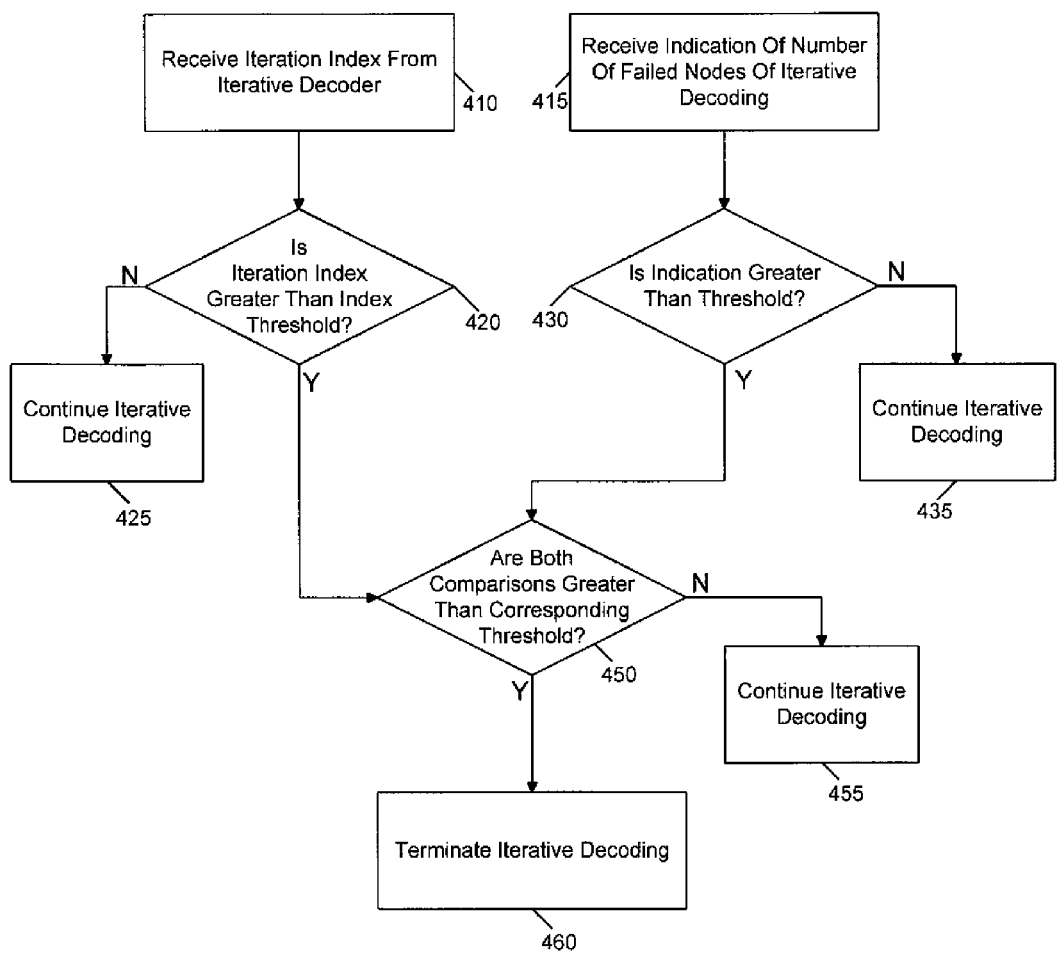
FIG. 6 is a flow diagram of a method in accordance with another embodiment of the present invention.

In addition to controlling power consumption in the face of successful error correction, embodiments of a power controller may instead control power consumption by preventing further iterative decoding when no successful error correction occurs. Referring now to FIG. 6, shown is a flow diagram of a method in accordance with another embodiment of the present invention. As shown in FIG. 6, method 400 may be performed by a power controller, and may begin by receiving an iteration index from the iterative decoder (block 410). This iteration index may be an indication of the number of iterations performed on a given data frame. This received iteration index may be compared to an iteration index threshold at diamond 420. If it is determined that the received iteration index is greater than the iteration index threshold, control passes to block 450, discussed further below. If instead the received iteration index is less than the iteration index, control passes to block 425, where iterative decoding may be continued.

Still referring to FIG. 6, method 400 may further perform a similar comparison of a no confidence soft bit sum (or false parity checksum) as described above with regard to FIG. 5. Specifically, method 400 may receive an indication of a number of failed nodes of the iterative decoder at each iteration (block 415). This received indication may be compared to a threshold to determine whether the indication is greater than a threshold (diamond 430). While the scope of the present invention is not limited in this regard, this threshold may be at a given level based on a percentage of false parity sums. In FIG. 5, the threshold may be set at a relatively low value to enable stopping the iterative decoder with few bit errors which will be correctable by an outer code. For FIG. 6, the threshold could be higher according to the iteration index to begin the checking. For example, if a maximum of 50 iterations per frame are allowed, it may be determined, e.g., at iteration 25 whether a 50% reduction of false parity sum in comparison to the first iteration has occurred. If this is not the case, the iterative decoder may be terminated to save the additional 25 iterations of processing. Another way would be to determine whether a 20% reduction in false parity sum is realized after iteration number 10. If the number of the indication is greater than this threshold, meaning that the number of errors is greater than the threshold, control passes to block 450. Otherwise, if it is determined that the indication is less than the threshold, control passes to block 435 where iterative decoding may continue.

Still referring to FIG. 6, at diamond 450 it may be determined whether both comparisons (of diamonds 420 and 430) indicate that the compared values are greater than the corresponding thresholds. If so, control passes to block 460 where iterative decoding may be terminated. Specifically, the iterative decoding may be terminated as there are difficulties in reducing bit errors. As such, useless power consumption can be avoided. Note that if both decision branches into diamond 450 are not in the affirmative, iterative decoding may otherwise continue (block 455).

Figure 7:
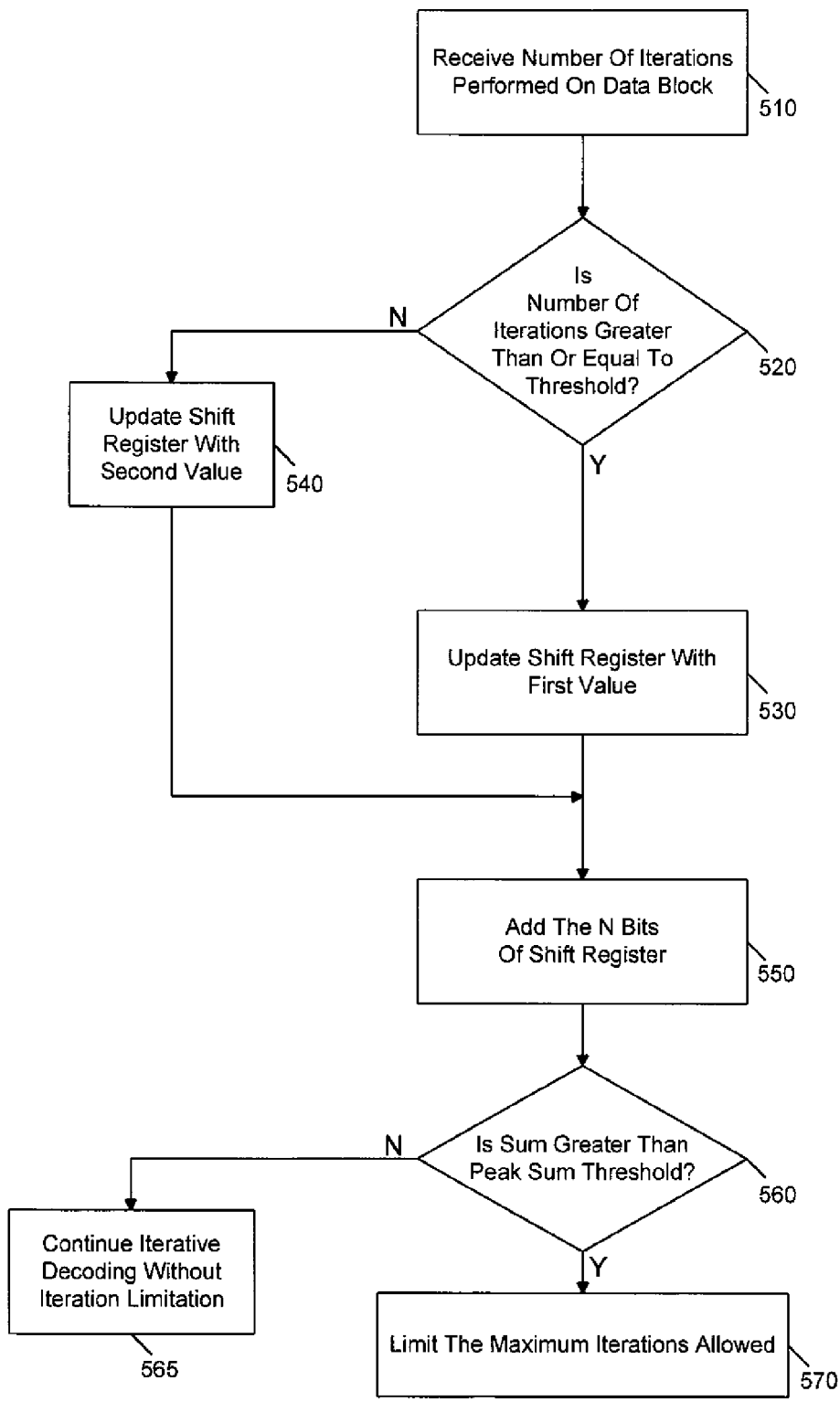
FIG. 7 is a flow diagram of a method for performing power control in accordance with yet another embodiment of the present invention.

As described above, in other implementations an iterative decoder may perform a number of iterations for a given data block (e.g. frame or sliding window) up to a maximum number of iterations allowed. However, the power controller may cause the iterative decoder to limit the number of maximum iterations allowed to reduce power consumption. Referring now to FIG. 7, shown is a flow diagram of a method for performing power control in accordance with yet another embodiment of the present invention. As shown in FIG. 7, method 500 may begin by receiving a value of a number of iterations that was performed on a given data block (block 510). In one embodiment, this data block may be of a sliding window of a plurality of frames (e.g., between approximately 16 and 64 frames). This information may be received in the power controller from the iterative decoder. Next at diamond 520 it may be determined whether the number of iterations performed for the data block is greater than or equal to an iteration threshold (diamond 520). While this threshold may be at the maximum iteration level, a fallback iteration limit may instead act as the threshold. Indeed, in this case FIG. 7 is able to switch between the "no iteration limitation" and "iteration limitation". If so, a shift register may be updated with a first value (block 530). This first value may in one embodiment be a logical one value. Otherwise, if the number of iterations provided is below the iteration threshold, the shift register may be updated with a second value (block 540). In this embodiment, the second value may be a logical zero value.

From both of blocks 530 and 540, control passes to block 550, where N bits of the shift register may be added together. This sum is thus a measure of a number of frames within the sliding window for which a maximum number of iterations was performed. Then, it may be determined at diamond 560 whether the sum of the shift register bits is greater than a peak sum threshold. While the scope of the present invention is not limited in this regard, this peak sum threshold may correspond to a percentage of shift register bits having a logic one value. For example, in one instance the shift register may be a 16-bit register. In such a case, the peak sum threshold may be between approximately 4 and 8, in one embodiment.

If the sum of the shift register bits is greater than the peak sum threshold, control passes to block 570 where the maximum number of iterations allowed may be limited. As one example, the maximum number of iterations allowed may be limited to 50% of the maximum iterations. If instead it is determined that the sum of the N bits of the shift registers is not greater than the peak sum threshold, control passes to block 565, where the iterative decoding may be continued without iteration limitation, that is, without limiting the maximum number of iterations allowed (block 565). While shown with this particular implementation in the embodiment of FIG. 7, the scope of the present invention is not limited in this regard.

Figure 8:
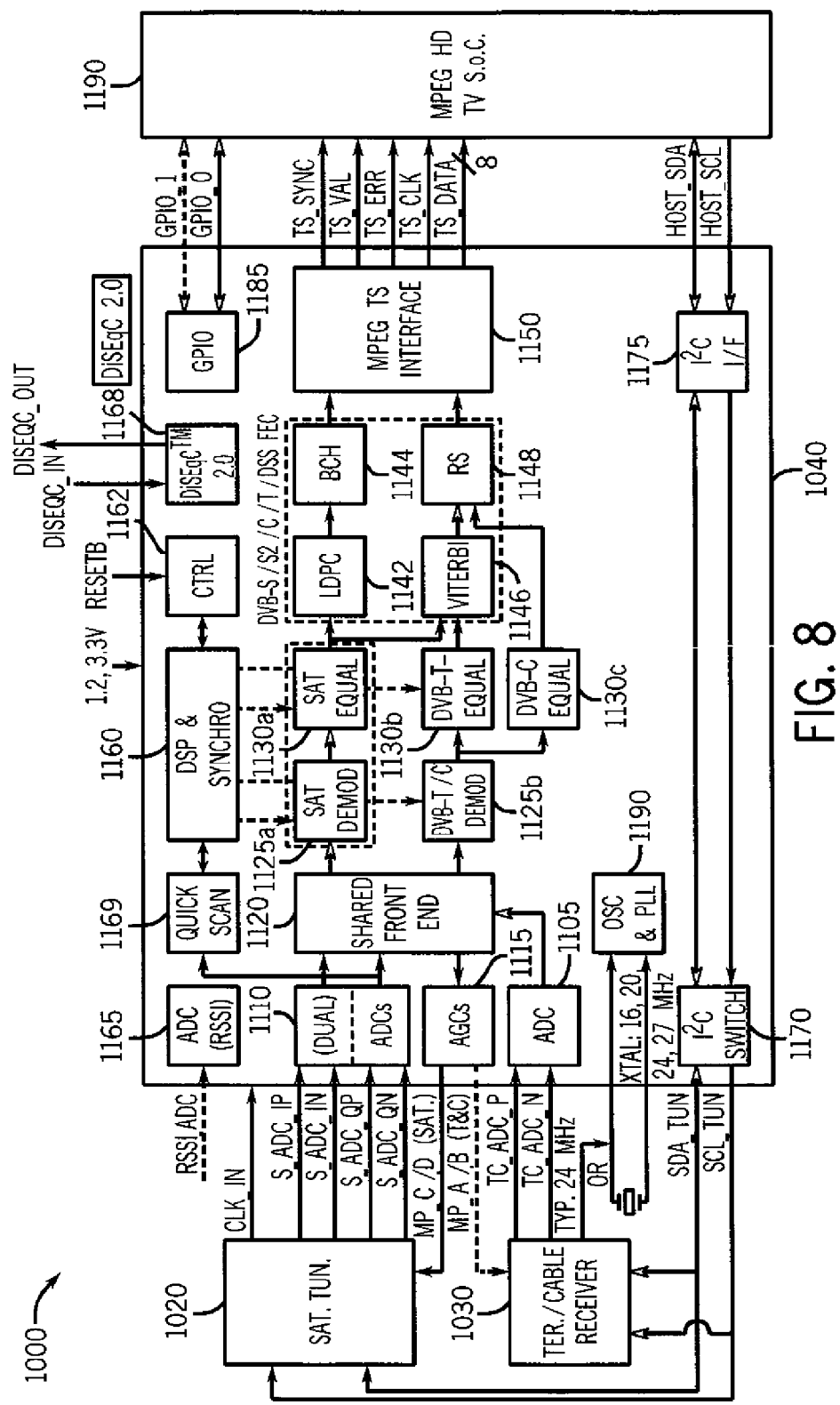
FIG. 8 is a block diagram of a system in accordance with one embodiment of the present invention.

Embodiments may be incorporated in many different types of systems employing an iterative decoder. Referring now to FIG. 8, shown is a block diagram of a system in accordance with one embodiment of the present invention. Specifically, FIG. 8 shows a system 1000 which in various embodiments may be part of a set-top box, a high definition TV or other application for use in handling receipt and processing of DVB signals. As seen, system 1000 includes a pair of tuners, each of which may be formed on a separate IC, although in some implementations such tuners as well as demodulator 1040 all may be integrated in one integrated circuit. Thus the two tuners, namely first tuner 1020 and second tuner 1030 may be configured to receive incoming RF signals of one or more DVB standards. Specifically, first tuner 1020 is configured to receive signals of a DVB-satellite standard, while second tuner 1030 may be configured to receive signals of a DVB-terrestrial or DVB-cable standard. Demodulator 1040 may be a demodulator including much shared circuitry to handle processing of signals of any DVB standards, reducing complexity, power consumption and size. In addition, system 1000 further includes a system-on-a-chip (SoC) 1190 that may be coupled to receive an output transport stream from demodulator 1040. Such SoC may be used to perform MPEG decoding to thus generate audio and video signals to be output to a display of system 1000 (not shown in FIG. 8).

FIG. 8 further shows the general signal processing path for the incoming signals, both for satellite-received signals and cable/terrestrial-received signals. In various embodiments, much sharing of components of the signal processing path may occur to thus reduce chip real estate. In this way, demodulator 1040 may be fabricated on a single die with a minimum amount of real estate consumed. That is, rather than having independent (i.e., dedicated) signal processing paths for multiple different standards that are adapted on either a single die or multiple dies, many of the components can be shared to provide as many opportunities for re-use for different standards as possible.

Specifically as seen in FIG. 8, incoming satellite signals are provided through ADCs 1110 to a shared front end 1120. This shared front end 1120 may further be configured to handle incoming cable or terrestrial signals received through ADC 1105. Thus a single front end is provided to perform various signal processing on incoming signals, which may be at a given IF, to filter and downconvert them to baseband signals.

With regard to a signal processing path for satellite signals, the processed signals from shared front end 1120 may be provided to a demodulator $1125_a$ which in various embodiments may include QPSK and 8PSK demodulators to handle a given DTV-S/S2 standard. Demodulation may be performed under control of a digital signal processor (DSP)/synchronizer 1160. The demodulated signals are then provided to an equalizer $1130_a$ for performing channel corrections. Depending on the given standard (e.g., DVB-S or DVB-S2) the equalized signals may be provided to different portions of a forward error correction (FEC) circuit 1140. Specifically, a first path may include a Viterbi decoder 1146 and a Reed-Solomon (RS) decoder 1148, which may be used to handle decoding of, e.g., DVB-S signals. If instead the incoming information is of the DVB-S2 standard, the equalized signals from equalizer $1130_a$ may be provided to a LDPC decoder 1420 and BCH decoder 1440. The LDPC and BCH decoders may provide for improved broadcast reception while limiting the size and power consumption of the demodulator, as described above. The decoded transport stream may be provided to a MPEG transport stream interface 1150 that in turn outputs various transport stream information to SoC 1190. The transport stream interface may be programmable to provide a flexible range of output modes and is fully compatible with any MPEG decoder or conditional access modules to support any back-end decoding chip.

For incoming terrestrial or cable signals from shared front end 1120, these signals are provided to a second demodulator 1125$_b$, one of a second equalizer 1130$_b$ and a third equalizer 1130$_c$ and onto shared FEC circuit 1140. Equalized terrestrial and cable signals may be decoded using Viterbi decoder 1146 and Reed-Solomon decoder 1148 before being output through MPEG transport stream interface 1150. Note that the circuitry of the signal processing paths may be dedicated hardware, in contrast to generic processing hardware such as present in DSP 1160.

Various other circuitry may be present within demodulator 1140, including, for example, a RSSI ADC 1165, automatic gain control circuitry 1150 which may, based on signal strength information, send various control signals to control gain elements of tuners 1020 and 1030. Additional interfaces include a DiSEqC™ interface 1168 for satellite dish control, a control interface 1162 which may receive an incoming reset signal and which is in communication with DSP/synchronizer 1160. In addition, various general-purpose IO signals may be communicated via a general-purpose IO interface 1185. I²C communication may be via an I²C switch 1170 and an I²C interface 1175. Various control and clock signals needed may be generated using an oscillator/phase lock loop 1190 which may be coupled to, e.g., an off-chip crystal or other clock source. While shown with this particular implementation in the embodiment of FIG. 8, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an integrated circuit (IC) receiver comprising:
     an iterative decoder including:
       a plurality of variable node processors each to receive a channel input and at least one of a plurality of check node values and to calculate a variable node value;
       a shuffle unit coupled to receive a variable node value from each of the plurality of variable node processors and to provide the variable node value to at least one of a plurality of check node processors coupled to the shuffle unit;
       the plurality of check node processors each to receive at least one variable node value and to calculate a check node value including a parity value and a magnitude value, wherein each of the plurality of check node processors is to provide a first output having a first value if the parity value is of a false parity;
       an adder coupled to the plurality of check node processors to receive the first output from each of the plurality of check node processors and to generate a false parity sum; and
       a controller coupled to the adder to receive the false parity sum and to control iterative decoding on a current block of the channel input based at least in part on the false parity sum.

2. The apparatus of claim 1, wherein the controller is to terminate the iterative decoding based at least in part on the false parity sum.

3. The apparatus of claim 2, wherein the controller is to compare the false parity sum to a first threshold and to terminate the iterative decoding if the false parity sum is greater than the first threshold, the first threshold indicative of unsuccessful decoding.

4. The apparatus of claim 3, where the controller is to compare an iteration index corresponding to a number of iterations performed in the iterative decoder on the current block to a second threshold, the second threshold less than a maximum number of iterations allowed to be performed by the iterative decoder on the current block, and terminate the iterative decoding only if the false parity sum is greater than the first threshold and the iteration index is greater than the second threshold.

5. The apparatus of claim 1, wherein the controller is to determine a number of times during a window that the iterative decoding is performed on a block of the channel input with an iteration number at least equal to a first threshold, and to limit a maximum number of iterations allowed to be performed on a block if the number of times is greater than a second threshold.

6. The apparatus of claim 5, further comprising a shift register including a plurality of entries each to store a first value if iterative decoding on a block of the channel input was performed the maximum number of iterations and to store a second value if iterative decoding on the block was not performed the maximum number of iterations.

7. The apparatus of claim 6, wherein the controller is to limit the maximum number of iterations if the stored number of times is greater than the second threshold.

8. The apparatus of claim 2, wherein the controller is to compare the false parity sum of an N iteration of the iterative decoder on the current block to the false parity sum of an N+1 iteration of the iterative decoder on the current block, and to terminate the iterative decoding if the false parity sum of the N+1 iteration is greater than the false parity sum of the N iteration.

9. The apparatus of claim 1, further comprising a channel noise estimator coupled to the controller to estimate a level of noise in a signal from which the channel input is obtained, wherein the controller is to terminate the iterative decoding if the noise level is greater than a first threshold.

10. The apparatus of claim 1, wherein the controller is to terminate the iterative decoding on the current block if the false parity sum is less than a threshold, wherein an outer decoder is coupled to the iterative decoder.

11. A method comprising:
    performing iterative decoding on a demodulated signal to provide a decoded signal;
    determining whether the iterative decoding is suffering an impairment; and
    terminating the iterative decoding responsive to the determination of the impairment, otherwise continuing the iterative decoding to provide the decoded signal.

12. The method of claim 11, wherein the determining includes comparing a temperature of an integrated circuit including the iterative decoder to a first threshold, and terminating the iterative decoding if the temperature is greater than the first threshold.

13. The method of claim 11, wherein the determining includes comparing a signal-to-noise ratio (SNR) of an incoming signal from which the demodulated signal is obtained to a second threshold, and terminating the iterative decoding or limiting a maximum number of iterations allowed to be performed on a block if the SNR is greater than the second threshold.

14. The method of claim 11, wherein the determining includes:
comparing a first sum of false parity results occurring in an N iteration of the iterative decoding on a block of the demodulated signal to a second sum of false parity results occurring in an N+1 iteration of the iterative decoding on the block of the demodulated signal; and
terminating the iterative decoding if the first sum of false parity results is less than the second sum of false parity results.

15. The method of claim 11, wherein the determining includes comparing a false parity sum of an iteration of the iterative decoding on a first block of the demodulated signal to a third threshold, and terminating the iterative decoding if the false parity sum is greater than the third threshold.

16. The method of claim 15, wherein the determining includes comparing the false parity sum of the iteration to a fourth threshold, and terminating the iterative decoding if the false parity sum is greater than the fourth threshold, wherein the fourth threshold is less than the third threshold and a second decoder is coupled downstream of the iterative decoder.

17. The method of claim 11, wherein the determining includes determining a number of iterations of the iterative decoding on each block or sliding window to obtain the decoded signal.

18. The method of claim 17, further comprising determining the number of iterations for a plurality of frames of the demodulated signal and comparing a mean value for the plurality of frames to a threshold, and terminating the iterative decoding or limiting a maximum number of iterations allowed to be performed on a block if the mean value is greater than the threshold.

19. A system comprising:
a receiver to receive radio frequency (RF) signals of a plurality of digital video broadcasting (DVB) standards and to downconvert the received RF signal to a baseband signal and demodulate the baseband signal into a demodulated signal, the receiver having a forward error correction (FEC) circuit including an iterative decoder to decode the demodulated signal into a decoded signal and a controller coupled to the iterative decoder to terminate the iterative decoding responsive to a determination that the iterative decoder is suffering an impairment, based at least in part on at least one of a temperature of the receiver and a signal-to-noise ratio of the received RF signal.

20. The system of claim 19, wherein the receiver includes at least one integrated circuit (IC) including a tuner to receive the RF signals of at least one DVB standard and to provide a downconverted signal to a second integrated circuit (IC) including the iterative decoder.

21. The system of claim 19, wherein the controller is to receive a sum corresponding to a number of check node processors of the iterative decoder having a false parity for a given iteration and to terminate iterative decoding on a current block of the demodulated signal based at least in part on a comparison between the sum and a threshold indicative of unsuccessful decoding.

\* \* \* \* \*